(12) United States Patent
Woodgate et al.

(10) Patent No.: US 9,080,752 B2
(45) Date of Patent: Jul. 14, 2015

(54) ILLUMINATION APPARATUS

(75) Inventors: Graham John Woodgate, Henley-on-Thames (GB); Jonathan Harrold, Upper Heyford (GB)

(73) Assignee: OPTOVATE LIMITED, Oxfordshire (GB)

( * ) Notice: Subject to any disclaimer, the term of this patent is extended or adjusted under 35 U.S.C. 154(b) by 0 days.

(21) Appl. No.: 13/880,508

(22) PCT Filed: Oct. 20, 2011

(86) PCT No.: PCT/GB2011/001513
§ 371 (c)(1),
(2), (4) Date: Sep. 30, 2013

(87) PCT Pub. No.: WO2012/052723
PCT Pub. Date: Apr. 26, 2012

(65) Prior Publication Data
US 2014/0016314 A1 Jan. 16, 2014

(30) Foreign Application Priority Data
Oct. 21, 2010 (GB) .................................. 1017769.9

(51) Int. Cl.
*H01L 21/00* (2006.01)
*F21V 21/00* (2006.01)
(Continued)

(52) U.S. Cl.
CPC . *F21V 21/00* (2013.01); *F21K 9/00* (2013.01); *F21V 29/70* (2015.01); *G02B 6/003* (2013.01); *G02B 6/0068* (2013.01); *G02F 1/133603* (2013.01); *G02F 1/133608* (2013.01); *H01L 25/0753* (2013.01); *G02B 6/0073* (2013.01); *G02B 6/0083* (2013.01); *H01L 33/0079* (2013.01); *H01L 33/58* (2013.01); *H01L 2224/16225* (2013.01); *H01L 2224/48091* (2013.01); *H01L 2224/73265* (2013.01);
(Continued)

(58) Field of Classification Search
USPC ....................... 438/22, 24–25, 27, 34; 257/13
See application file for complete search history.

(56) References Cited

U.S. PATENT DOCUMENTS 6,163,557 A 12/2000 Dunnrowicz et al.
6,462,358 B1 10/2002 Lin et al.
(Continued)

FOREIGN PATENT DOCUMENTS

EP 0644443 A1 3/1995
EP 0796506 B1 4/2003
(Continued)

OTHER PUBLICATIONS

ISA European Patent Office, International Search Report for Application No. PCT/GB2011/001513, mailed Feb. 22, 2012.
(Continued)

Primary Examiner — Charles Garber
Assistant Examiner — Evren Seven
(74) Attorney, Agent, or Firm — Ingrassia Fisher & Lorenz, P.C.

(57) ABSTRACT

A light emitting element array for an illumination apparatus, an illumination apparatus and method of manufacture of the same in which an array of light-emitting elements and an array of light directing optics are provided between first and second attached mothersheet substrates wherein the thermal resistance of at least one of the mothersheet substrates is reduced by means of thickness reduction so as to provide reduced LED junction temperature.

17 Claims, 9 Drawing Sheets

(51) Int. Cl.
*F21K 99/00* (2010.01)
*F21V 8/00* (2006.01)
*H01L 25/075* (2006.01)
*G02F 1/1335* (2006.01)
*F21V 29/70* (2015.01)
*H01L 33/00* (2010.01)
*H01L 33/58* (2010.01)

(52) U.S. Cl.
CPC ............ *H01L2924/09701* (2013.01); *H01L 2924/10253* (2013.01); *H01L 2933/0033* (2013.01)

(56) References Cited

U.S. PATENT DOCUMENTS

| | | | |
|---|---|---|---|
| 6,547,423 | B2 | 4/2003 | Marshall et al. |
| 7,045,375 | B1 * | 5/2006 | Wu et al. .................. 438/35 |
| 7,550,319 | B2 * | 6/2009 | Wang et al. .................. 438/125 |
| 8,324,029 | B2 * | 12/2012 | Ohtorii .................. 438/118 |
| 2001/0035580 | A1 | 11/2001 | Kawai |
| 2004/0180470 | A1 | 9/2004 | Romano et al. |
| 2006/0044803 | A1 | 3/2006 | Edwards |
| 2006/0077692 | A1 | 4/2006 | Noh et al. |
| 2006/0124917 | A1 * | 6/2006 | Miller et al. .................. 257/13 |
| 2006/0289892 | A1 | 12/2006 | Lee et al. |
| 2007/0004066 | A1 | 1/2007 | Wuu et al. |
| 2007/0051960 | A1 * | 3/2007 | Yu .................. 257/88 |
| 2007/0236628 | A1 | 10/2007 | Epstein |
| 2008/0055534 | A1 * | 3/2008 | Kawano .................. 349/161 |
| 2009/0213301 | A1 * | 8/2009 | Tanabe .................. 349/65 |
| 2010/0317132 | A1 * | 12/2010 | Rogers et al. .................. 438/27 |
| 2011/0038150 | A1 | 2/2011 | Woodgate et al. |
| 2013/0107525 | A1 | 5/2013 | Woodgate et al. |

FOREIGN PATENT DOCUMENTS

| | | |
|---|---|---|
| EP | 1569467 A2 | 8/2005 |
| GB | 2371923 A | 8/2002 |
| JP | H11126923 A | 5/1999 |
| WO | 2009130944 A1 | 10/2009 |

OTHER PUBLICATIONS

UKIPO, British Search Report for Application No. GB1017769.9, dated Dec. 1, 2010.

ISA European Patent Office, International Preliminary Report on Patentability for Application No. PCT/GB2011/001513, dated Apr. 23, 2013.

UKIPO, British Examination Report for Application No. GB1307217.8, dated Nov. 28, 2013.

UKIPO, British Examination Report for Application No. GB1307217.8, dated Mar. 24, 2014.

* cited by examiner

ILLUMINATION APPARATUS

CROSS-REFERENCE TO RELATED APPLICATION

This application is a U.S. National-Stage entry under 35 U.S.C. §371 based on International Application No. PCT/GB2011/001513, filed Oct. 20, 2011 which was published under PCT Article 21(2) and which claims priority to British Application No. 1017769.9, filed Oct. 21, 2010, which are all incorporated herein by reference in their entirety.

TECHNICAL FIELD

The technical field relates to an illumination apparatus and a method for fabrication of the illumination apparatus. Such an apparatus may be used for domestic or professional lighting, for liquid crystal display backlights and for general illumination purposes.

BACKGROUND

Incandescent light sources are low cost but have low efficiency, and are relatively large requiring large light fittings. Fluorescent lamps in which a gas discharge generates ultra-violet wavelengths which pumps a fluorescent material to produce visible wavelengths, have improved efficiency compared to incandescent sources, but also have a large physical size. Heat generated by inefficiencies in these lamps is typically radiated into the illuminated environment, such that there is typically little need for additional heatsinking arrangements. In this specification, an illumination apparatus refers to an illumination apparatus whose primary purpose is illumination of an environment such as a room or street scene, or as a display backlight such as an LCD backlight. An illumination apparatus is typically capable of significantly higher luminance than 1000 nits. This is opposed to for example displays, whose primary purpose is image display by providing light to a viewing observer's eyes so that an image can be seen. By way of comparison, if the luminance of a display is very high, for example greater than 1000 nits, then disadvantageously a display can be uncomfortably bright to view. Thus the considerations for an illumination apparatus with a primary illumination purpose and a display apparatus that provides a secondary illumination purpose are different.

If an illumination apparatus is used as a backlight in a display apparatus, losses in the spatial light modulator of the display apparatus will reduce the luminance to a level suitable for comfortable viewing. Thus such an arrangement has a secondary illumination function that is not generally suitable for the purpose of efficient and bright illumination of an environment.

Light-emitting diodes (LEDs) formed using semiconductor growth onto monolithic wafers can demonstrate significantly higher levels of efficiency compared to incandescent sources. In this specification LED refers to an unpackaged LED die (chip) extracted directly from a monolithic wafer, i.e. a semiconductor element. This is different from packaged LEDs which have been assembled into a package to facilitate subsequent assembly and may further incorporate optical elements such as a hemispherical structure which increases its size but increases light extraction efficiency. To optimise quantum efficiency, extraction efficiency and lifetime, it is desirable to minimise the junction temperature of the LED. This is typically achieved by positioning a heat dissipating structure (or heatsink) on the rear of the LED to provide extraction of heat from the chip into an ambient environment.

LED primary heatsinks typically comprise heat slugs (or heat spreaders), LED electrodes, and the dielectric layer of a metal core printed circuit board (MCPCB). LED secondary heat sinks typically comprise the metal layer of the MCPCB, MCPCB solder attachment points and formed fins in metal or thermally conductive plastic material attached to or formed on the primary heatsink arrangement. For illustrative purposes, in this specification, primary thermal resistance refers to the thermal resistance to heat generated in a light emitting element formed by the light emitting element itself, respective heat spreading elements, electrodes and electrically insulating support substrate (such as the dielectric layer of an MCPCB). The secondary thermal resistance is defined by the thermal resistance of subsequent elements, including the metal layer of an MCPCB, MCPCB solder attachment points and heatsink elements.

Assembly methods for known macroscopic LEDs typically of size 1×1 mm comprise a pick-and-place assembly of each LED chip onto a conductive heat slug for example silicon. The heat slug is attached to a dielectric which is bonded on a metal layer, forming a metal core printed circuit board (MCPCB). Such a primary heatsink requires multiple pick-and-place operations and is bulky and costly to manufacture. It would thus be desirable to reduce primary heatsink complexity.

Secondary heatsinks can be heavy, bulky and expensive. It is thus desirable to minimise the thickness of the secondary heatsink by minimising the resistance of the thermal paths of the primary heatsink.

In lighting applications, the light from the emitter is typically directed using a luminaire structure to provide the output directionality. The angular variation of intensity is termed the directional distribution which in turn produces a light radiation pattern on surfaces in the illuminated environment and is defined by the particular application. Lambertian emitters provide light to the flood a room. Non-Lambertian, directional light sources use a relatively small source size lamp such as a tungsten halogen type in a reflector and/or reflective tube luminaire, in order to provide a more directed source. Such lamps efficiently use the light by directing it to areas of importance. These lamps also produce higher levels of visual sparkle, in which the small source provides specular reflection artefacts, giving a more attractive illumination environment. Further, such lights have low glare, in which the off-axis intensity is substantially lower than the on-axis intensity so that the lamp does not appear uncomfortably bright when viewed from most positions.

Directional LED illumination apparatuses can use reflective optics (including total internal reflective optics) or more typically catadioptric (or tulip) optic type reflectors, as described for example in U.S. Pat. No. 6,547,423. Catadioptric elements employ both refraction and reflection, which may be total internal reflection or reflection from metallised surfaces.

PCT/GB2009/002340 describes an illumination apparatus and method of manufacture of the same in which an array of microscopic LEDs (of size for example 0.1×0.1 mm) is aligned to an array of micro-optical elements to achieve a thin and efficient directional light source. GB1005309.8 describes an illumination apparatus, a method of manufacture of the same and a heat sink apparatus for use in said illumination apparatus in which an array of optical elements directs light from an array of light emitting elements through a heat dissipating structure to achieve a thin and efficient light source that provides directional illumination with efficient dissipation of generated heat into the illuminated environment.

In addition, other objects, desirable features and characteristics will become apparent from the subsequent summary and detailed description, and the appended claims, taken in conjunction with the accompanying drawings and this background.

SUMMARY

According to an aspect of the present disclosure, there is provided a method of manufacturing an illumination apparatus whose primary purpose is illumination as opposed to display; the method may comprise: (i) providing a light emitting element array, the light emitting element array comprising a plurality of light emitting elements arrayed on a first side of a first substrate, and providing the light emitting element array comprising forming the plurality of light emitting elements and thereafter positioning them in an array on the first side of the first substrate; and (ii) reducing the thickness of the light emitting element array by reducing the thickness of the first substrate by removing material from the direction of the second side of the first substrate. Prior to step (i), a plurality of heat spreading elements may be provided wherein in step (i) respective heat spreading elements may be positioned between the first substrate and respective light emitting elements. Further an optical array may be provided comprising a plurality of directional optical elements arrayed on a first side of a second substrate; with the step before step (ii) is performed, of forming a structure comprising the light emitting element array and the optical array, with the first side of the first substrate facing the first side of the second substrate, and with respective light emitting elements aligned with respective optical elements; and thereafter, performing step (ii) whereby consequently the thickness of the structure is reduced. The thickness of the structure may be further reduced by reducing the thickness of the second substrate by removing material from the direction of the second side of the second substrate. After step (ii), the following step may be performed: (iii) increasing the thickness of the light emitting element array by providing one or more heatsink structures at the second side of the first substrate. The thickness added to the light emitting element array by step (iii) may be greater than the thickness by which the thickness of the light emitting element array was reduced by step (ii). The weight added to the light emitting element array structure by step (iii) may be greater than the weight by which the weight of the light emitting element structure was reduced by step (ii). The method may further comprise, prior to providing the light emitting element array, providing a plurality of heat spreading elements wherein, in the step of providing the light emitting element array, respective heat spreading elements are positioned between the first substrate and respective light emitting elements. The plurality of light emitting elements may be selectively removed from a monolithic wafer in a manner that preserves the relative spatial position of the selectively removed light-emitting elements. The material of at least the first substrate may comprise a ceramic material. The material of at least the first substrate may comprise a glass material. The material of at least the first substrate may comprise a conductive filler material. The heat spreading elements may comprise a metallic film formed on the first substrate. The thickness of the first substrate after step (ii) may be between 0.01 mm and 1.1 mm thick, for example, between 0.02 mm and 0.4 mm thick and in one example, between 0.05 mm and 0.2 mm thick. The method may further comprise: forming at least one seal between the first and second substrates.

According to an aspect of the present disclosure there is provided an illumination apparatus formed by the above method.

According to an aspect of the present disclosure there is provided an illumination apparatus whose primary purpose is illumination as opposed to display, the illumination apparatus may comprise a light emitting element array; the light emitting element array may comprise a plurality of light emitting elements arrayed on a first substrate, the light emitting elements having been arrayed on the first substrate after the light emitting elements were formed; wherein the substrate may be of reduced thickness compared to what its thickness was when the plurality of light emitting elements were arrayed on the first substrate. The apparatus may further comprise a plurality of heat spreading elements, respective heat spreading elements being positioned between the first substrate and respective light emitting elements. The apparatus may further comprise a structure comprising the light emitting element array and an optical array, the optical array comprising a plurality of directional optical elements arrayed on a first side of a second substrate; the first side of the first substrate facing the first side of the second substrate, and respective light emitting elements aligned with respective optical elements; wherein the structure may be of reduced thickness compared to what its thickness was when the light emitting element array and the optical array were placed together, by virtue of the light emitting element array being of reduced thickness compared to what its thickness was when the light emitting element array and the optical array were placed together. The light emitting element array may further comprise one or more heatsink structures at the second side of the first substrate. The one or more heatsink structures may be in combination thicker than the amount by which the substrate is of reduced thickness compared to what its thickness was when the plurality of light emitting elements were arrayed on the substrate. The one or more heatsink structures may be in combination of greater weight than the amount by which the substrate is of reduced weight due to the thickness reduction compared to what its weight was when the plurality of light emitting elements were arrayed on the substrate prior to the thickness reduction. The apparatus may further comprise a plurality of heat spreading elements wherein respective heat spreading elements are positioned between the first substrate and respective light emitting elements. The material of at least the first substrate may comprise a ceramic material. The material of at least the first substrate may comprise a glass material. The material of at least the first substrate may comprise a conductive filler material. The heat spreading elements may comprise a metallic film formed on the first substrate. The metallic film may be of thickness greater than 100 nanometers, generally of thickness greater than 1 micrometer and in one example, of thickness greater than 10 micrometers. The reduced thickness of the first substrate may be between 0.01 mm and 1.1 mm thick, generally between 0.02 mm and 0.4 mm thick and in one example, between 0.05 mm and 0.2 mm thick. Each light-emitting element may have a maximum width or diameter less than or equal to 500 micrometers generally less than or equal to 250 micrometers and in one example, less than or equal to 100 micrometers. Each optical element may have a maximum height less than or equal to 5 millimeters, generally less than or equal to 2.5 millimeters and in one example, less than or equal to 1 millimeter. The apparatus may further comprise at least one seal between the first and second substrates.

According to an aspect of the present disclosure there is provided a backlight apparatus comprising the apparatus of the above aspect, further comprising a light guide plate and at least one output coupling optical element.

Compared to known illumination apparatuses, the present embodiments advantageously provide reduced thermal resistance to heat generated in an LED array, thus providing higher device efficiency, longer lifetime and greater reliability. Further, the cost of the apparatus is reduced as secondary heatsink cost is reduced. The substrates can advantageously be formed from glass and can thus be made with very large area using known handling methods and can undergo known large area masking processes. The embodiments advantageously provide many LED illumination devices with low thermal resistance to be processed in parallel, reducing cost. The step of reducing thermal resistance may be provided after forming the LED illumination apparatus cell comprising LED and optical substrates, thus providing greater reliability and strength of the illumination apparatus during and after manufacture, further reducing cost. The thermal expansion of illumination apparatus substrates can be matched, reducing thermal distortion effects and providing greater reliability. The illumination apparatus can be conveniently arranged to provide a thin and efficient backlight apparatus. Further an addressable backlight apparatus with high resolution and large area can conveniently be arranged, so as to improve display contrast.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

Embodiments of the present disclosure will now be described, by way of example only, with reference to the accompanying drawings in which:

FIG. 34b shows in plan view the backlight illumination apparatus of FIG. 34a.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1:
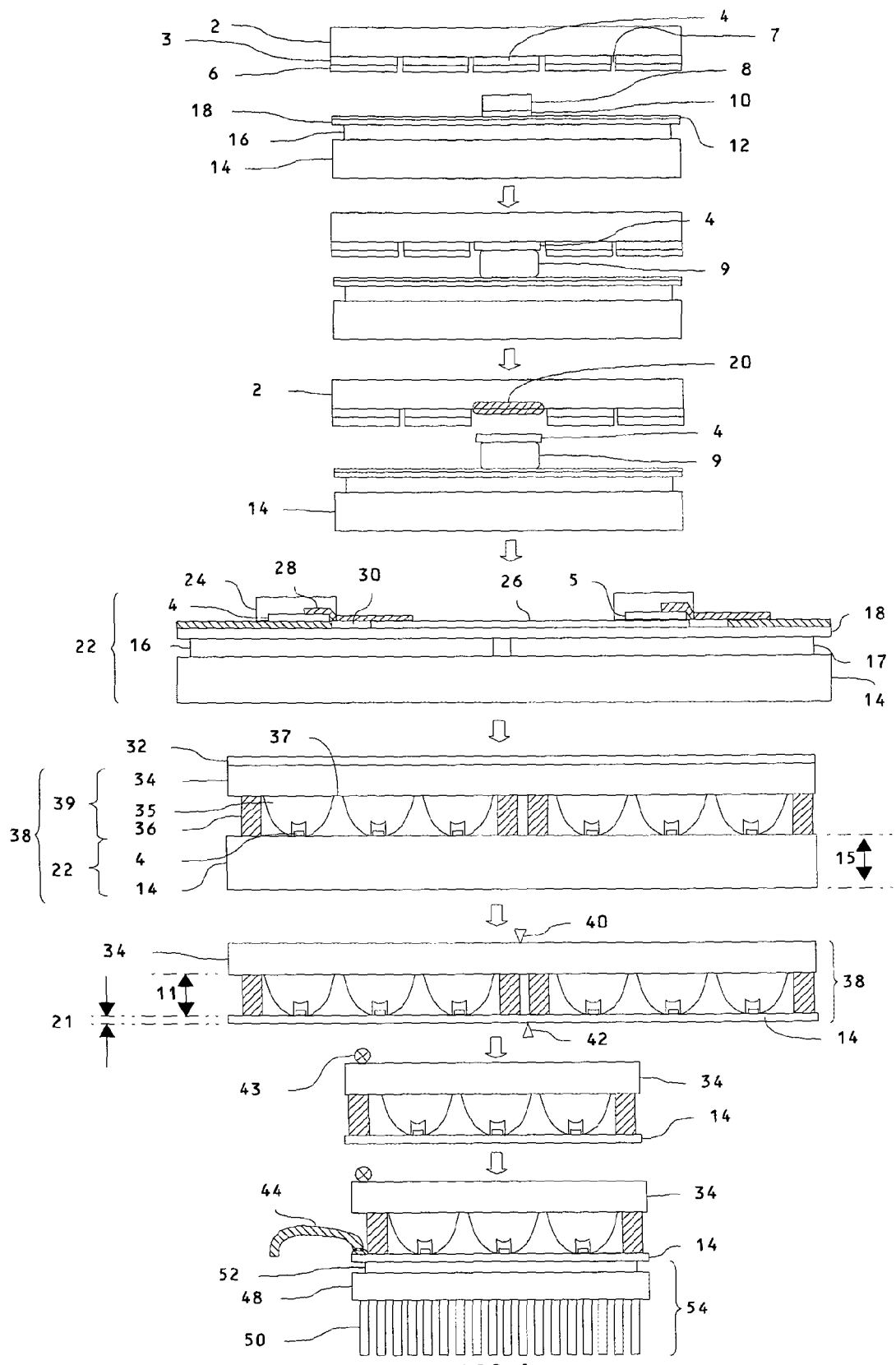
FIG. 1 shows a method to form an illumination apparatus comprising heatsink structures.

A method to form an illumination apparatus is shown in FIG. 1. In a first step, a monolithic wafer comprises a substrate 2 which may be for example sapphire and a layer 3 of light emitting elements 4 such as light emitting diodes (LEDs) formed on its surface, for example in Gallium Nitride. A first bonding layer 6 which may comprise metal materials such as palladium is formed on the surface of layer 3 and gaps 7 provided between the light emitting elements 4 on the wafer, for example by etching, sawing or laser scribing. Alternatively, the layer 3 may be continuous. A glass substrate 14 (which may be termed a motherglass) has a heat spreading element 16 formed on its surface, a dielectric layer 18 (that may be patterned) and patterned electrode layer 12 formed thereon. On the surface of the electrode 10, a second bonding layer comprising a first metal layer 10 for example comprising palladium and a second metal layer 8 for example indium is formed. The second bonding layer is patterned so that bonding regions are aligned with light emitting element 4. Other metal layers in substitution of or in addition to palladium and indium may be used, as is known in the art and including but not limited to titanium, tantalum, gold, tin, indium tin oxide, aluminium, platinum, and nickel.

In a second step, the first and second aligned bonding layers 6, 8, 10 are brought into contact and the sandwich is heated so as to provide an alloy bond layer 9 between the electrode layer 12 and the respective light emitting element 4. For example the layers 6, 8, may be heated to for example 180 degrees Celsius to provide a rugged electrical and mechanical bond between the element 4 and electrode 12.

In a third step, the interface of the layer 3 and substrate 2 is illuminated by short pulse ultraviolet radiation in region 20 so as to provide decomposition of the gallium and nitrogen close to the sapphire interface. On heating the sandwich to above the melting point of metallic gallium, for example to greater than about 40 degrees Celsius, the substrates 2, 14 can be separated as shown, with the element 4 attached to the substrate 14 and adjacent light emitting elements in layer 3 remain attached to the substrate 2.

The second bonding layer 8,10 and ultraviolet illumination is patterned so that it can be further arranged in alignment with some others of the light emitting elements, for example light emitting element 5 to form a plurality of light emitting elements 4,5 arrayed on the first side of the substrate 14. Thus a light emitting element array 22 comprises a plurality of light emitting elements 4,5 arrayed on a first side of a first substrate 14. Advantageously, the patterning of the layers 8, 10 and of laser illumination in region 20 mean that elements 4,5 from the layer 3 may be selectively extracted with a pitch substantially the same as the pitch of the respective elements in the monolithic wafer. Thus the plurality of light emitting elements 4,5 are selectively removed from a monolithic wafer 2,3 in a manner that preserves the relative spatial position of the selectively removed light-emitting elements 4,5. Such an arrangement advantageously provides accurate location with a subsequent array of optical and electrical connection elements. Further a plurality of heat spreading elements 16 are provided on the substrate 14; wherein respective heat spreading elements are positioned between the first substrate 14 and respective light emitting elements 4,5.

In a fourth step (shown without bonding layers and for a pair of light emitting elements 4,5 on substrate 14), an LED light emitting element array 22 is formed comprising substrate 14, heat spreading elements 16, 17, phosphor elements 24, bottom electrode 26, top electrode 28 and dielectric region 30. Other known wavelength conversion layers may be substituted for phosphor elements 24. In the current embodiments, each of the steps to form a particular feature can be performed in parallel for all of the light emitting elements 4 transferred onto the substrate 14. Advantageously, such a method can significantly reduce the processing cost of such a device. In this embodiment, the primary heatsink comprises the bottom electrode 26, dielectric layer 18, heat spreading element 17 and substrate 14.

In a fifth step, an optical substrate 34 is formed comprising an array of catadioptric directional optical elements 35 optionally separated by gaps 37. Alternatively, the directional optical elements may be reflective or refractive. Advantageously, catadioptric optical elements provide efficient capture of LED light and a directional output light beam with relatively small thickness and width for a given cone angle compared to for example parabolic optical elements. The optical substrate 34 may be formed by moulding of an optically transparent polymer material onto a support glass substrate 34 using an appropriately shaped mould. The optical substrate 34 is aligned with the LED substrate array 22 and seal regions 26 are formed to provide an illuminator cell 38. The cell may be spaced by seal 36 and or optic array 35. The gaps 37 advantageously reduce the amount of bending of the substrate 34 due to differences in shrinkage during formation of the optical elements 35. Alternatively, the gap region 37 may comprise thin regions of the material used to form the elements 35. Thus at least one seal region 26 may be formed between the first substrate 14 and second substrate 34.

The process steps described above require many different operations to be performed on the substrate 14. In manufacture, such a substrate must have sufficient ruggedness to be undamaged by handling and processing, but must have sufficient flatness and surface finish to be suitable for lithographic processing. Advantageously, substrate 14 may comprise a glass substrate, such as used in the manufacture of liquid crystal display devices. The glass may further comprise chemical strengthening properties, such as incorporated in Dragontrail glass marketed by Ashahi glass or Gorilla glass marketed by Corning. However, glass substrates have a low thermal conductivity, typically about 1 WK-1m-1 and glass substrates suitable for large area lithographic processing are typically of thickness about 0.5 mm or more. Such a substrate will result in a high primary thermal resistance to the flow of heat from the LED and increase LED junction temperature.

In a sixth step, the thickness 15 of the illuminator cell 38 is reduced by means known means such as grinding, polishing, chemical etching either singularly or in any combination. Thus the sixth step reduces the thickness of the light emitting element array 4,5,14 by reducing the thickness 15 of at least the substrate 14 by removing material from the direction of the second side of the first substrate 14 to provide a thickness 21. The thickness of the first substrate after the thickness reduction step may be between about 0.01 mm and about 1.1 mm thick; in one example between about 0.02 mm and about 0.4 mm thick and in one example, between about 0.05 mm and about 0.2 mm thick. Advantageously the primary thermal resistance of the first substrate to heat produced in the light emitting element array is reduced. This increases the thermal resistance provided by the secondary heatsink, and thus reduces the cost of the system in comparison to the arrangement in which the substrate thickness has not been reduced. Glass of thickness less than about 0.4 mm and in one example, glass of thickness less than about 0.2 mm can be susceptible to damage and surface distortion during handling unless adequately stabilised. Advantageously the attachment of substrate 14 to the substrate 34 provides mechanical stability such that after the thickness reduction step the substrate 14 has mechanical ruggedness during subsequent processing and handling steps.

Further, the thickness reduction step can be undertaken on the cell 38 to provide additional mechanical ruggedness during processing and after lithographic and other processing of the LED elements, thus enabling the substrate 14 to be formed from glass for example. Further the seals 36 protect the LEDs 5 and optics 35 from possible damage during the thickness reduction step and subsequent handling. The increased mechanical ruggedness of the assembled cell advantageously reduces the chance of breakage during handling and thus increases manufacturing yield and reduces device cost.

The substrates 34, 14 may have their thickness reduced by different or similar amounts depending on the thermal resistance required in each thermal path for heat generated in the light emitting elements.

The light emitting elements 4 may be microscopic LEDs; that is they have dimensions with a maximum width or diameter of less than about 500 micrometers, for example, less than 250 micrometers and in one example, less than 100 micrometers. Microscopic LEDs of size 100 micrometers advantageously use optical elements 35 arranged to provide directionality that have a pitch of approximately 2 mm or less and a maximum height 11 of about 5 mm or less, for example, a maximum height 11 of about 2.5 mm or less and in one example, a maximum height of about 1 mm or less. Thus, the total cell 38 thickness may be of thickness for example 2 mm before the thickness reduction step. Such cells are conveniently handled using known substrate processing equipment, thus reducing cost of fabrication. Advantageously the thermal resistance of the substrate 14 is less than the thermal resistance of the substrate 34, thus providing a preferred path for heat dissipation from the rear of the LED substrate array 22. Further, microscopic LEDs of size for example 100 micrometers advantageously achieve better heat dissipation than large LEDs for a given current density. Advantageously, microscopic LEDs can utilise primary heatsinks with higher thermal resistance than larger LEDs and thus are more suitable for use with low thermal conductivity materials such as glass, while achieving similar or better performance.

Thus an illumination apparatus whose primary purpose is illumination as opposed to display is formed by providing a light emitting element array comprising a plurality of light emitting elements 4,5 arrayed on a first side of a first substrate 14; providing an optical array 39 comprising a plurality of directional optical elements 35 arrayed on a first side of a second substrate 34; forming a structure 38 comprising the light emitting element array 22 and the optical array 39, with the first side of the first substrate 14 facing the first side of the second substrate 34, and with respective light emitting elements 4 aligned with respective optical elements 35. The thickness of the structure 38 may be reduced by reducing the thickness 15 of at least the first substrate 14 by removing material from the direction of the second side of the substrate to provide a reduced thickness 21 of the substrate 14. The thickness of the structure 38 may be further reduced by reducing the thickness of the second substrate 34 by removing material from the direction of the second side of the second substrate.

In a seventh step, regions of cell 38 may be scribed, for example by means of scribes 40, 42 or laser cutting (not shown) on each respective substrate between seal 36 regions, or as required. The cutting marks 40, 42 may be offset to facilitate breaking of the substrates 14, 34 to aid singulation of the devices. Thus at least two different regions of the light emitting element array 22 are separated. Advantageously, multiple light emitting element arrays can be produced from a single array 22. In this manner, highly parallel processing techniques can be used, significantly reducing device cost. The scribe points 40 and 42 may be slightly offset to aid singulation.

In an eighth step, the cell 38 may be separated (or singulated) for example by breaking the cell 38. Anti-reflection coating 43 may be applied, or alternatively coating 43 may be applied to the substrate 34 prior to formation of optical elements 35, or prior to singulation.

In a ninth step, further elements may be attached including electrodes 44 and heatsink element 54 comprising a heat spreading plate 48 and fins 50, attached by means of a thermally transmitting interface 52. Interface 52 further provides a mechanically compliant thermally conductive layer on the first substrate 14 to provide an interface between the glass substrate 14 and heat spreading element plate 48 of the heatsink element 54. Thus a heatsink element 54 is attached to the second side of the first substrate 14.

Thus a light emitting element array for an illumination apparatus whose primary purpose is illumination as opposed to display may be formed by providing a light emitting element array structure 38 comprising a plurality of light emitting elements 4 arrayed on a first side of first substrate 14; reducing the thickness of the light emitting element array structure 38 by reducing the thickness of the first substrate 14 by removing material from the direction of the second side of the first substrate 14; and increasing the thickness of the light emitting element array structure 38 by providing one or more heatsink structures 52, 48, 50 at the second side of the first substrate 14. The thickness added to the light emitting element array structure 38 is greater than the thickness by which the thickness of the light emitting element structure 38 was reduced. Further, the weight added to the light emitting element array structure by providing the heatsink structures 52,48,50 is greater than the weight by which the weight of the light emitting element structure 38 was reduced. Advantageously such an arrangement provides a cheaper secondary heatsink in comparison to an apparatus in which the structure 38 is not reduced thickness, while providing mechanical ruggedness during processing and handling.

Thus a method of manufacturing an illumination apparatus whose primary purpose is illumination as opposed to display may comprise the following: (i) providing a light emitting element array, the light emitting element array comprising a plurality of light emitting elements arrayed on a first side of a first substrate, and the step of providing the light emitting element array comprising forming the plurality of light emitting elements and thereafter positioning them in an array on the first side of the first substrate; and (ii) reducing the thickness of the light emitting element array by reducing the thickness of the first substrate by removing material from the direction of the second side of the first substrate. The method may further comprise, prior to step (i), providing a plurality of heat spreading elements wherein in step (i) respective heat spreading elements are positioned between the first substrate and respective light emitting elements. The method may further comprise providing an optical array comprising a plurality of directional optical elements arrayed on a first side of a second substrate; before step (ii) is performed, forming a structure comprising the light emitting element array and the optical array, with the first side of the first substrate facing the first side of the second substrate, and with respective light emitting elements aligned with respective optical elements; and thereafter, performing step (ii) whereby consequently the thickness of the structure is reduced. After step (ii), step (iii) may be performed comprising increasing the thickness of the light emitting element array by providing one or more heatsink structures at the second side of the first substrate. The thickness added to the light emitting element array by step (iii) may be greater than the thickness by which the thickness of the light emitting element was reduced by step (ii). The weight added to the light emitting element array structure by step (iii) may be greater than the weight by which the weight of the light emitting element structure was reduced by step (ii).

Thus an illumination apparatus whose primary purpose is illumination as opposed to display may comprise a light emitting element array 22; the light emitting element array 22 may comprise a plurality of light emitting elements 4 arrayed on a first substrate 14, the light emitting elements 4 having been arrayed on the first substrate 14 after the light emitting elements 4 were formed; wherein the substrate 14 is of reduced thickness compared to what its thickness was when the plurality of light emitting elements 4 were arrayed on the first substrate 14. The apparatus may further comprise a structure comprising the light emitting element array 22 and an optical array 39, the optical array 39 comprising a plurality of directional optical elements 35 arrayed on a first side of a second substrate; the first side of the first substrate facing the first side of the second substrate 34, and respective light emitting elements 4 aligned with respective optical elements 35; wherein the structure 38 is of reduced thickness compared to what its thickness was when the light emitting element array 22 and the optical array 39 were placed together, by virtue of the light emitting element array 22 being of reduced thickness compared to what its thickness was when the light emitting element array and the optical array were placed together.

Advantageously, the step of reducing the thickness of the substrate 14 reduces the thermal resistance of the substrate 14 and thus the primary thermal resistance. Such a reduction in thermal resistance means that the thermal resistance of the secondary heatsink can be increased in order to achieve desired junction temperature for a certain ambient temperature. Higher thermal resistance heatsinks typically use less material and are cheaper, thus reducing illumination apparatus cost.

The substrate 14 may be formed from a ceramic material (an inorganic, non-metallic solid prepared by the action of heat and subsequent cooling with a crystalline or partly crystalline structure) such as aluminium oxide or aluminium nitride. Alternatively, the substrate material may be a glass material (an inorganic, non-metallic solid prepared by the action of heat and subsequent cooling with an amorphous structure) comprising for example sodalime or borosilicate compositions. Prior to the step of reducing its thickness, the glass substrate 14 may have a thickness of about 1.1 mm, 0.7 mm, 0.5 mm, 0.4 mm or may alternatively be thin glass such as Corning 0211 microsheet. The glass thickness may be determined so as to provide rugged processing of large sheets prior to the thickness reduction process, at which stage a support structure such as substrate 34 and optical elements 36 is provided to prevent damage to the substrate 14 during processing. Advantageously suitable glass may be provided with large size and high flatness suitable for photolithographic processing at low cost compared to equivalent ceramic substrates.

Advantageously, glass materials have well characterised surface flatness and roughness together with bulk material properties that are appropriate for the accurate and repeatable deposition of electrodes, heat spreading elements, dielectrics, adhesives and solders. Such a substrate advantageously provides low cost and very large area substrates for the attachment of light emitting elements. Advantageously, glass substrates are compatible with known large area sheet (motherglass, or mothersheet) processes in which multiple lithographic and other processes can be performed across the sheet in parallel. Such sheets can be fabricated at low cost and very high area, such as greater than 1×1 meter. The glass of the substrate 14 is not required to be transmissive and may further comprise conductive filler materials (which may be opaque) such as carbon, metals or ceramics with a thermal conductivity arranged to increase the thermal conductivity of the substrate 14, for example to greater than about 1.5 WK-1m-1, for example, greater than 5 WK-1m-1 and in one example, greater than 10 WK-1m-1, reducing the primary thermal resistance while maintaining characteristics suitable for photolithography and other large area array processing steps.

LED arrays are often formed by means of pick-and-place methods rather than the parallel method similar to that described in FIG. 1. Such pick and place LED arrays do not typically benefit from parallel processing of many elements once they have been removed from the wafer. Further pick and place LED arrays typically require large chip sizes (for example 1×1 mm) to provide sufficient area for wire bond pads; and to reduce the number of pick and place operations, and thus cost, for a particular light output.

In comparison to small chip sizes with size for example of less than about 0.3×0.3 mm, for example, less than about 0.2×0.2 mm and in one example, less than about 0.1×0.1 mm typically achieve a lower junction temperature for a given heatsink arrangement. Advantageously, reduced junction temperature achieves higher output efficiency and device lifetime. Typically small chip sizes may use higher thermal resistance materials for primary heatsinks, reducing cost and enabling the use of substrates such as glass. As described herein, glass has many properties that are suitable for large area parallel processing.

Thus for a given design junction temperature, small chips can use higher thermal resistance primary heatsink arrangements in comparison with large chips. Thus, particularly when combined with heat spreading embodiments and small chips provided by parallel placement, the glass substrates of the present embodiments can unexpectedly achieve low junction temperatures for small chip sizes while enabling the use of thin glass substrates. Small chips can advantageously be fabricated by means of the methods described in PCT/GB2009/002340.

The sparse array of light emitting elements 4,5 may alternatively be extracted and transferred onto the mothersheet substrate 14 by means of a transfer carrier such as a vacuum tool, an adhesive layer, or a wax layer for example. Advantageously, such an arrangement does not risk damage to the un-transferred elements on the substrate 2 during the attachment step.

Figure 2:
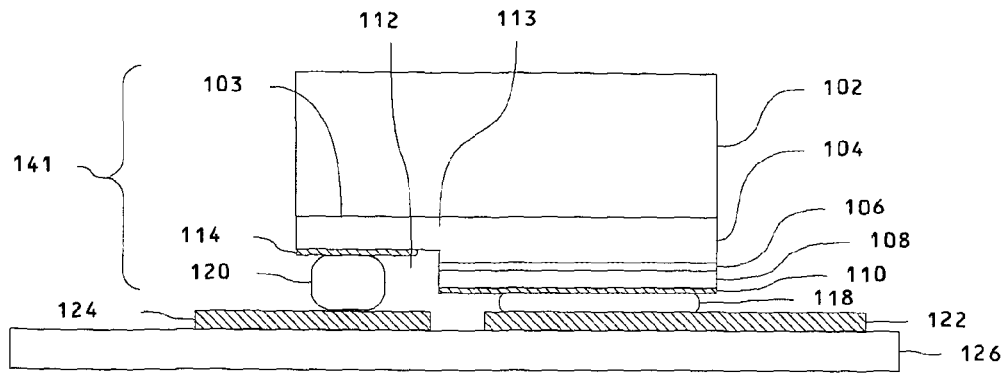
FIG. 2 shows a flip chip LED with lateral electrical connections.

The light emitting element 4 may comprise for example a known type of flip chip lateral configuration LED 141 as shown with electrical connections in FIG. 2. A substrate 102 such as sapphire has epitaxial layers formed on its surface 103. Typically a Gallium Nitride device comprises an n-doped layer 104, a multiple quantum well structure 106 and a p-doped layer 108 with a p-electrode 110. In the region 112, a portion of the p-layer 108 and structure 106 is removed to provide a contact electrode 114 to be formed in contact with the n-doped layer 104. This arrangement suffers from current crowding in the region 113, reducing the maximum light output that can be obtained from the device. Solder connections 118, 120 are formed on electrodes 122, 124 respectively, mounted on a support substrate 126. In this specification, the term solder connections refers to known electrical connections including those formed by heating or by pressure or combination of heating and pressure applied to suitable electrically conductive materials. Further, solder connections may be formed by the curing of metal doped adhesive materials such as silver epoxy.

Figure 3:
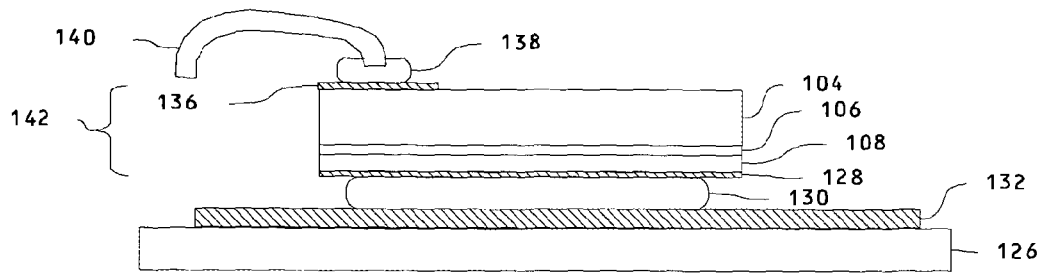
FIG. 3 shows a vertical thin film LED.

The light emitting element 4 may alternatively comprise a known type of VTF (vertical thin film) configuration LED 142 as shown in FIG. 3, in which the n-doped layer 104 has been separated from the substrate 102, for example by means of laser lift off. An electrode 128 is applied to the p-doped layer 108 and attached by means of a solder element 130 to an electrode 132 formed on the substrate 126. The n-doped layer may have an electrode 136 to provide a solder 138 contact to an input electrode 140. Such a VTF configuration advantageously has reduced current crowding compared to the arrangement of FIG. 2. However, the VTF configuration needs an electrode connection on the top surface, and so typically requires a wire bonding process. By way of comparison with the present embodiments, which employ large arrays of small LEDs, a large number of time consuming wire bonds would be needed. Further, wire bonding technology may have limited positional accuracy so that a large non-emitting bond pad 136 is required for reliable wire bonding. For example, the wire bond pad size may be 100 micrometers wide, comparable to the size of the LED.

Figure 4:
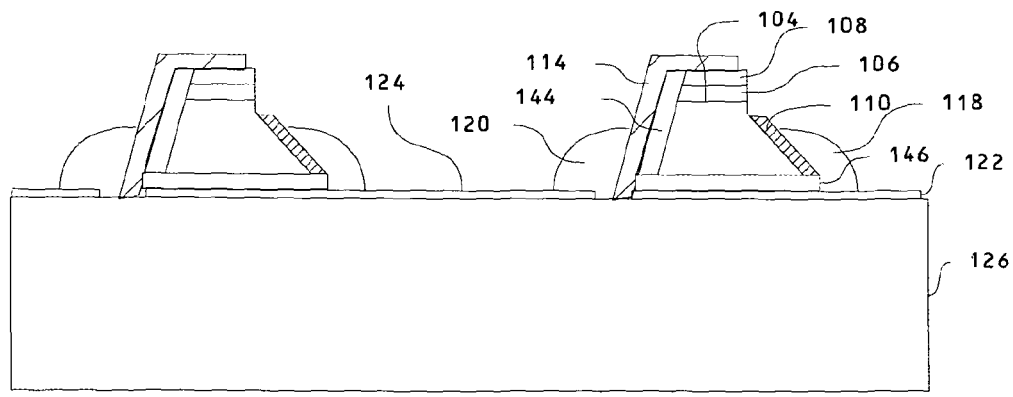
FIG. 4 shows an LED array with lateral electrical connections.

FIG. 4 shows a detail of LED elements after extraction and further processing steps (not shown). As the array of LEDs is positioned with lithographic precision (with original wafer positions preserved), then the electrode connections can be made in parallel by metal deposition and precision photolithography (as opposed to wire bonding) process. The LEDs may incorporate inclined surfaces and dielectric layers 144 so as to provide convenient connection to the chip via solder contacts 118, 120. Advantageously this high accuracy process achieves many simultaneous connections and also reduces the size of the electrode connection pad.

Figure 5:
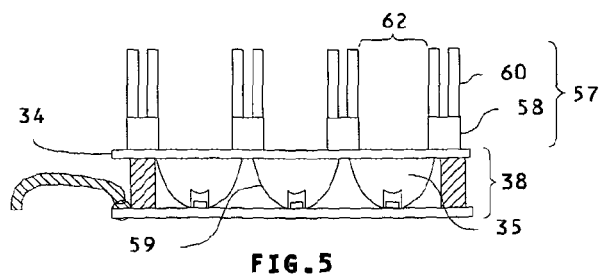
FIG. 5 shows in cross section a further illumination apparatus comprising heatsink structures.
Figure 6:
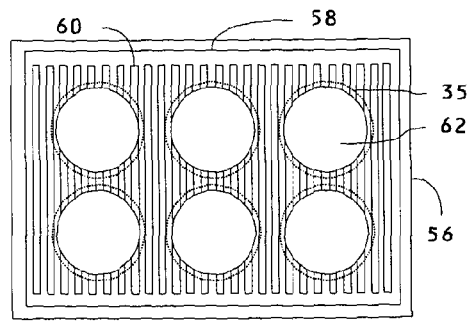
FIG. 6 shows in plan view the illumination apparatus of FIG. 5.

FIG. 5 shows an embodiment in which the substrate 34 is thinned in addition to the substrate 14. A single electrical connection 33 may be provided to the array of light emitting elements. Advantageously the substrate 34 may be formed from the same material used to form the substrate 14. Such a sandwich has matched coefficients of thermal expansion and will thus have minimised bending over a temperature cycle, increasing device reliability. A secondary heatsink element 57 is attached to the second side of the substrate 34 comprising a heat spreading element 58 and conductive fins 60. Apertures 62 are incorporated between the fins and heat spreading element so as to provide a path for light from the optical elements 35. FIG. 6 shows in plan view the top secondary heatsink 56 of FIG. 5. Thus the second substrate 34 comprises an opaque layer provided with light transmitting apertures 62. Advantageously such an arrangement reduces thermal resistance of the light output side of the illumination apparatus to heat generated in the light emitting elements.

Figure 7:
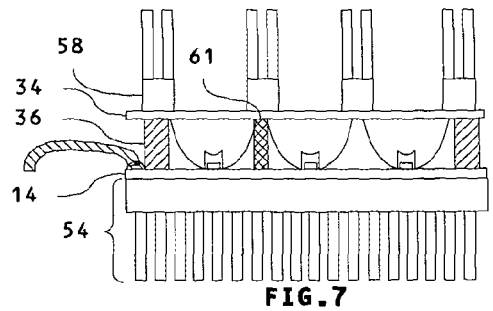
FIG. 7 shows in cross section a further illumination apparatus with a heatsink.
Figure 8:
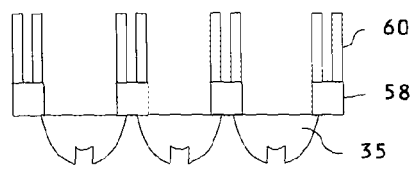
FIG. 8 shows an optical substrate for an illumination apparatus.
Figure 9:
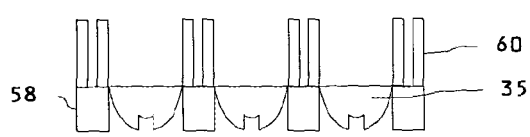
FIG. 9 shows a further optical substrate for an illumination apparatus.

FIG. 7 shows an embodiment comprising front and rear secondary heatsinks. Thermal paths in the primary heatsink between top and bottom substrates may be provided for example within sealing pillars 36 or using spacers 61, such as metal spacers in the primary heatsink path, connected to the LED substrate 14. Thus a spacer may be provided between the first and second substrates. FIG. 8 shows an alternative front substrate in which glass substrate 34 is not present, but replaced by a heatsink with aligned optical elements and thus may have a lower cost. FIG. 9 shows a similar arrangement but the optical elements are within the heat spreading element 58. Advantageously, such an arrangement has a reduced thermal resistance between the LED substrate array 22 (not shown) and heatsink 58.

Figure 10:
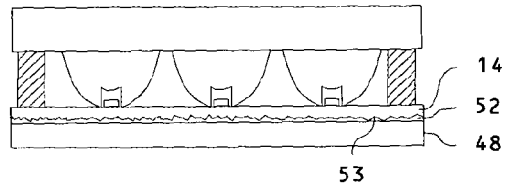
FIG. 10 shows a roughened substrate arranged to provide improved heat extraction from an LED array.
Figure 11:
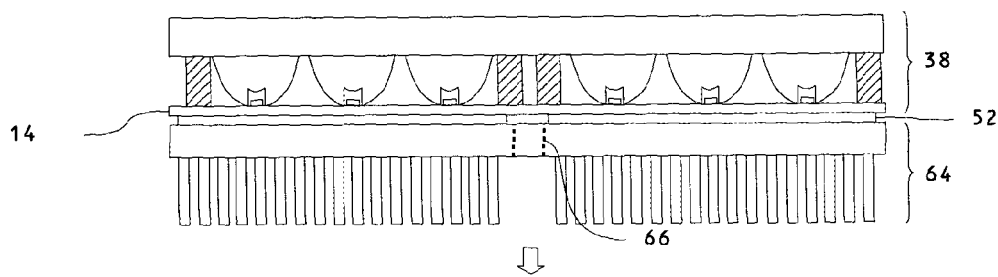
FIG. 11 shows a method to form an illumination apparatus comprising a heatsink structure with an optical array.

FIG. 10 shows an embodiment in which the thickness reduction step produces a rough surface 53 on the rear of the glass substrate 14. Such a surface may advantageously provide reduced thermal resistance compared to a smooth surface when combined with heatsink compound 52. FIG. 11 shows a further embodiment in which a heatsink 64 of similar area to substrate 14 is attached to the cell 38 prior to the singulation step. Such a heatsink may be formed in metal such as aluminium or may be in a thermally conductive material such as carbon fibre or thermally conductive polymer for example that marketed with the trade name Stanyl. The heat spreading plate is cut at lines 66 and in a further step, the cell is singulated prior to separation of the devices. Advantageously, such an embodiment can further reduce the cost of assembly of the illumination apparatus. Alternatively, the heatsink can be attached after singulation of the cell 38.

Figure 12A:
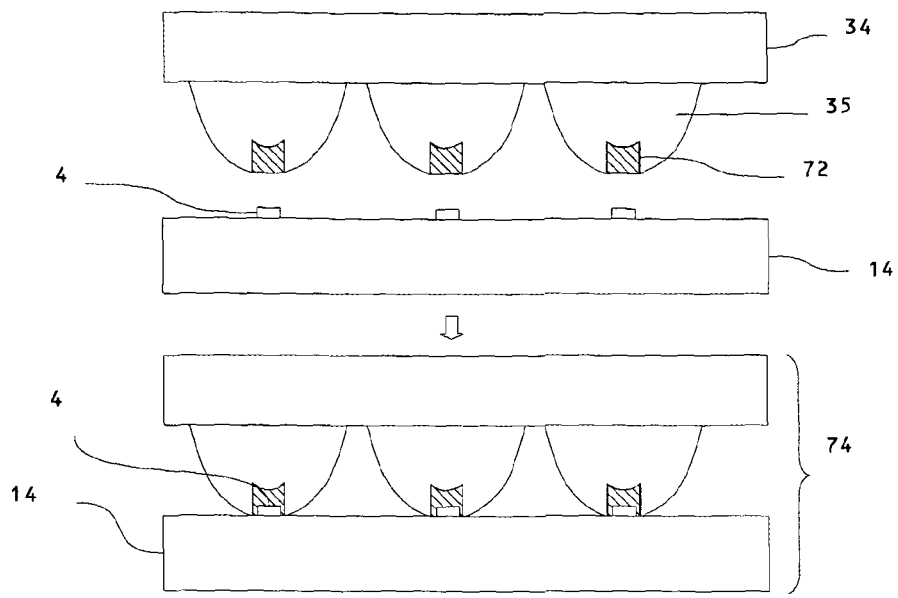
FIG. 12a shows a method to attach an optical substrate with an LED substrate.
Figure 12B:
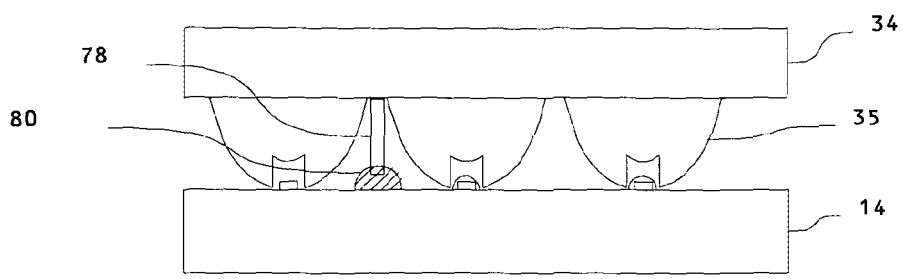
FIG. 12b shows a further method to attach an optical substrate with an LED substrate.

FIG. 12a shows a further embodiment in which the method of attachment of the substrate 34 and substrate 14 is by means of an optical adhesive material 72 (which may have a low refractive index) incorporated in the cavity of the catadioptric optic element 35. After alignment, the adhesive material 72 may be cured to provide both mechanical bonding and optical functions. The refractive index of the material 72 may be substantially lower than the refractive index of the material of the optical element 35. FIG. 12b shows an alternative embodiment incorporating pillars 78 of material which may be the same as the material used to form the optical elements 35. An adhesive 80 may be applied to the substrate 14 to provide attachment of the substrates and a rugged cell for subsequent processing and handling.

Figure 13:
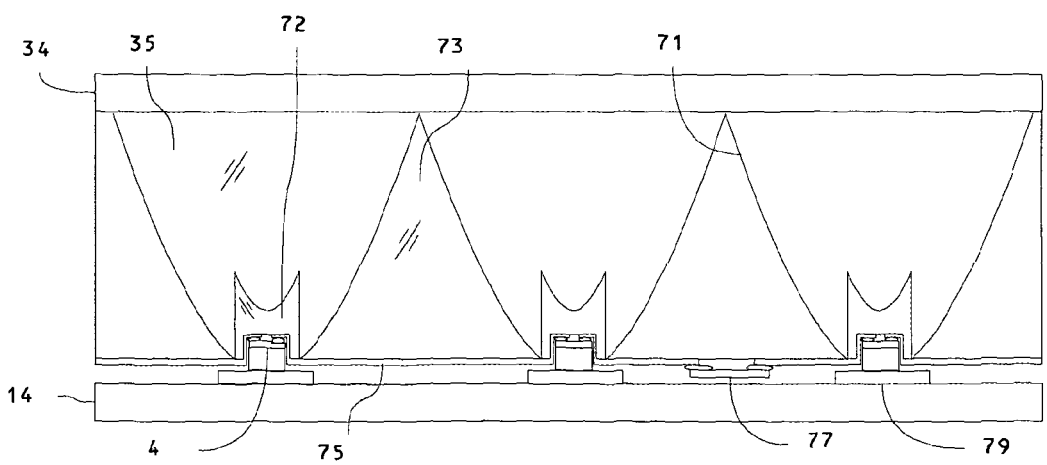
FIG. 13 shows an optical substrate further comprising electrodes and light emitting elements.

FIG. 13 shows a further embodiment wherein reflective surfaces 71 are formed with a metallisation and a material 73 is incorporated between catadioptric optical elements 35 so as to provide a substantially plane surface between the light emitting elements on which electrodes 75 can be formed. In this manner, the optical element 35, 73, 34 can comprise a support substrate for electrode 75s, wavelength conversion layers and light emitting elements 4 as well as active electronic components 77 such as transistors and resistors. The heat spreading elements 79 can be attached to the light emitting elements and substrate 14. Advantageously such elements do not require electrodes to be formed thereon and so have low complexity and do not require precision alignment.

Figure 14:
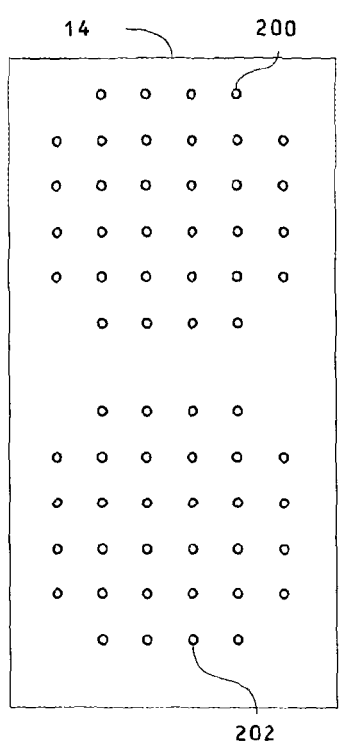
FIG. 14 shows an LED substrate comprising an array of connection elements.
Figure 15:
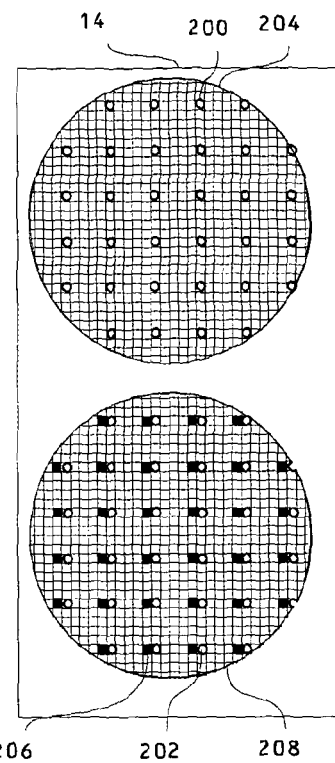
FIG. 15 shows the alignment of monolithic LED wafers with the LED substrate of FIG. 13.

FIG. 14 shows in plan view a glass substrate 14 comprising an array of connecting elements 200, which may comprise palladium and indium materials, or other known electrically and thermally conductive materials. FIG. 15 shows alignment of monolithic wafer 204 such that connecting elements 200 are in alignment with some of the light emitting elements of the monolithic wafer 204. An additional wafer 208 is aligned with an array of connecting elements 202. The wafer 208 has regions 206 in which light emitting elements 4 were removed in a previous alignment and bonding step. Alternatively the light emitting elements 4 may be transferred through intermediate transfer substrates to avoid damage to the wafer 204, 208 during the attachment step.

Figure 16:
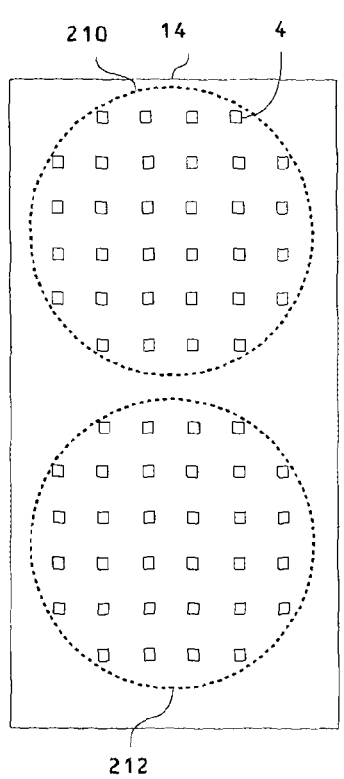
FIG. 16 shows the LED substrate following selective removal of LEDs from respective monolithic LED wafers.
Figure 17:
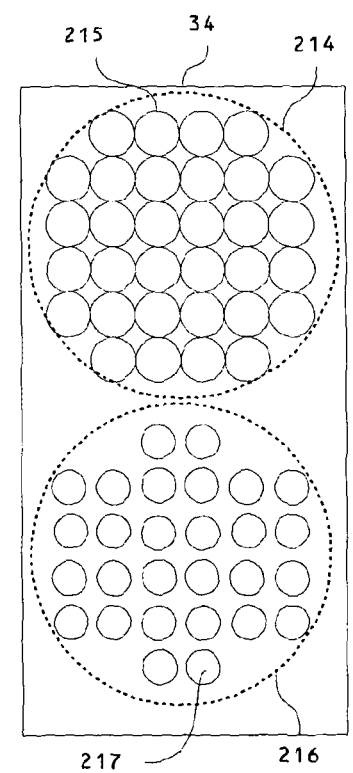
FIG. 17 shows an optical array substrate.

FIG. 16 shows the substrate 14 after the light emitting elements 4 have been removed from the respective monolithic wafers 204, 208. The light emitting elements are arranged in regions 210, 212. FIG. 17 shows in plan view an optical substrate 34 comprising a glass sheet with a first region 214 of optical elements 215 and a second region 216 of optical elements 217 different from elements 217.

Figure 18:
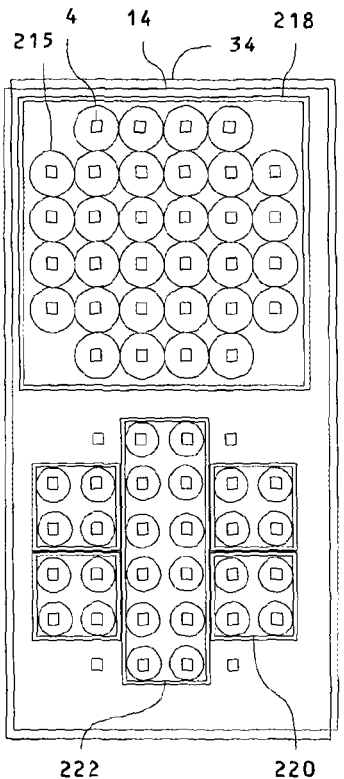
FIG. 18 shows the alignment of the optical array substrate of FIG. 16 with the LED substrate of FIG. 15.
Figure 19:
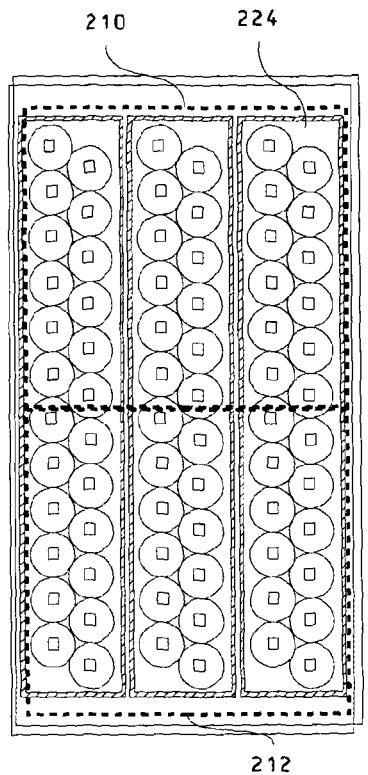
FIG. 19 shows a further aligned optical array substrate and LED substrate.
Figure 20:
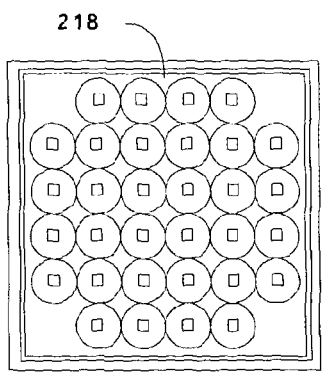
FIG. 20 shows a singulated substrate.
Figure 21:
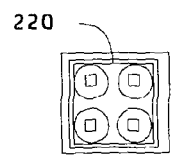
FIG. 21 shows a further singulated substrate.
Figure 22:
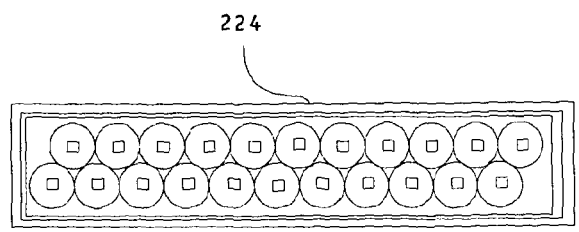
FIG. 22 shows a further singulated substrate.

FIG. 18 shows the alignment of substrates 14 and 34 from FIGS. 16 and 17 respectively. Seal regions 218, 220, 222 between the first substrate 14 and second substrate 34 are arranged so that different areas of illuminator devices can be extracted from the same illuminator cell. FIG. 19 shows an alternative arrangement of seal regions 224 arranged to provide elongate illuminators, for example for use in fluorescent tube and troffer replacements. FIGS. 20 and 21 show separated elements from FIG. 18 and FIG. 22 shows a separated element form FIG. 19. Additional seal regions (not shown) may be included within the singulated devices to provide increased ruggedness.

In this manner, the light emitting elements from many wafer separation steps can be combined onto single substrates. The substrate may comprise all or some of the light emitting elements 4 from a single wafer, or may comprise light emitting elements 4 from different wafers. Advantageously the shape and size of the illumination device need not be determined by the size and shape of the monolithic wafer. Advantageously such a process provides motherglass processing so that many devices can be processed in parallel, reducing cost while maintaining the thermal performance of the primary heatsink. Advantageously, the thickness reduction step achieves a primary heatsink thermal resistance that is minimised in devices that are formed on glass substrates.

Figure 23:
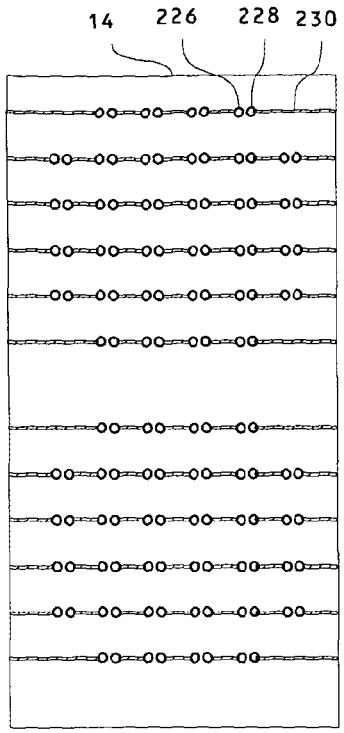
FIG. 23 shows in plan view an LED substrate comprising an array of connection elements and an array of electrode elements.

FIG. 23 shows in plan view an illustrative example of substrate 14 arranged to provide connection to a plurality of light emitting elements 4. Substrate 14 has electrical connection regions 226, 228 formed on its surface, connected by means of electrodes 230. The electrical connection regions further provide heat spreading elements arranged for reducing the primary thermal resistance to heat generated in the plurality of light emitting elements 4.

Figure 24:
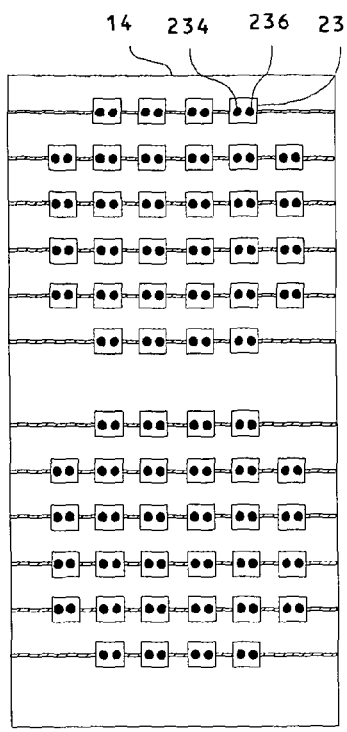
FIG. 24 shows the LED substrate of FIG. 23 further comprising an array of heat spreading elements.

FIG. 24 shows the alignment of an array of for example silicon heat spreading elements 232 to the electrical connection regions 226, 228. Further electrical connection regions 234, 236 are provided on the silicon heat spreading elements 232. The array of silicon heat spreading elements may be from a silicon wafer for example. The heat spreading elements 232 may be from a monolithic array of silicon heat spreading elements and may be extracted in parallel onto the substrate 14 with their separation preserved. Advantageously, such an arrangement provides for precise alignment of the array of silicon heat spreaders with the plurality of light emitting elements 4 extracted from a monolithic wafer with their separation preserved.

Figure 25:
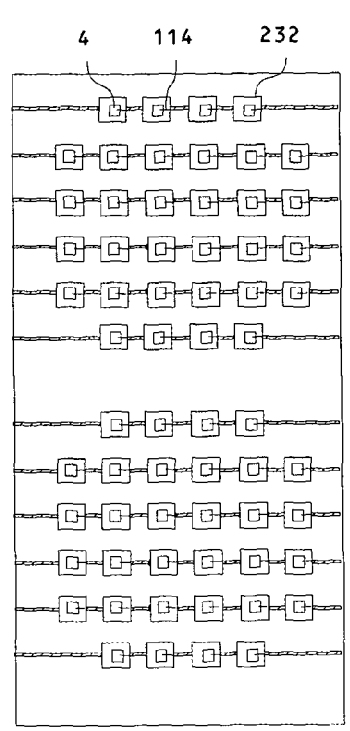
FIG. 25 shows the LED substrate of FIG. 24 further comprising an array of LEDs and electrode elements.
Figure 26:
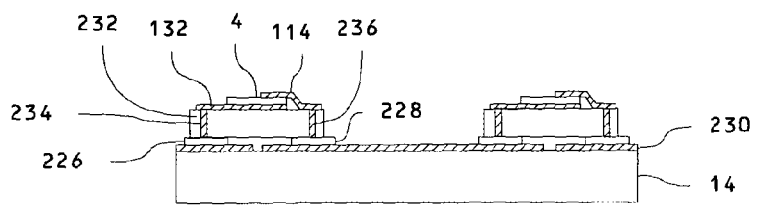
FIG. 26 shows in cross section a detail of the arrangement of FIG. 25.
Figure 27:
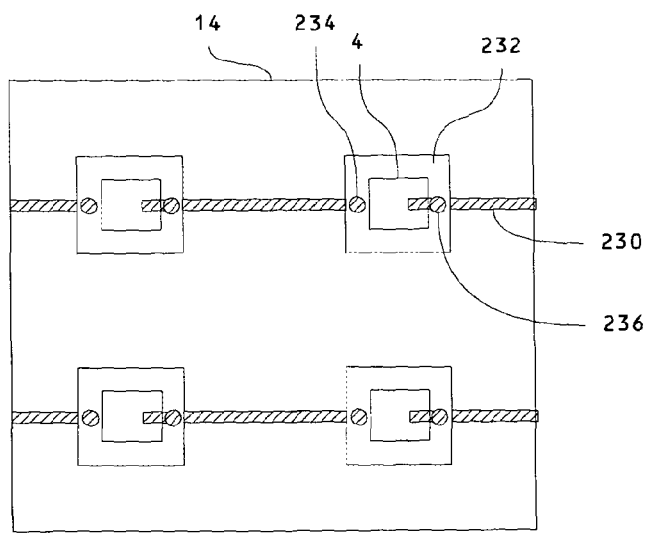
FIG. 27 shows in plan view a detail of the arrangement of FIG. 25.

Alternatively, the heat spreading elements 232 may be provided by a known pick-and-place method. FIG. 25 shows light emitting elements 4 and top connecting electrodes 114 mounted on the silicon heat spreading elements 232. FIG. 26 shows in cross section a portion of the structure of FIG. 25. Substrate 14 has electrodes 230 formed for example by lithographic processing. Connection regions 226, 228, such as solder are provided for connection to the heat spreading element 232. Via holes 234, 236 are metallised to provide connection regions to achieve electrical connection paths between the first substrate 14 and the plurality of light-emitting elements, so connecting the light emitting element 4 bottom electrode 132 and top electrode 114 respectively. Thus the heat spreading elements 232 comprise via holes 234, 236 arranged to provide electrical connection paths between the first substrate 14 and the plurality of light-emitting elements 4. FIG. 27 shows in further detail a plan view of the embodiment of FIG. 26.

Advantageously the embodiment makes use of photolithographic parallel processing techniques and can be implemented over large areas, reducing cost. Such an embodiment advantageously provides enhanced primary heatsink arrangement compared to an embodiment in which the light emitting element 4 is mounted directly onto a dielectric. The silicon heat spreading element has a high thermal conductivity so that heat is distributed over a wider area than from the individual light emitting element 4. Thus, the primary thermal resistance is reduced. Advantageously the secondary thermal resistance may be increased, providing a lower cost and less bulky secondary heatsink.

The silicon heat spreading elements of FIG. 27 are relatively thick and require mechanical positioning technologies. To provide a non mechanically positioned heat spreading layer and reduce cost, the heat spreading layer may comprise deposited silicon layers.

Figure 28:
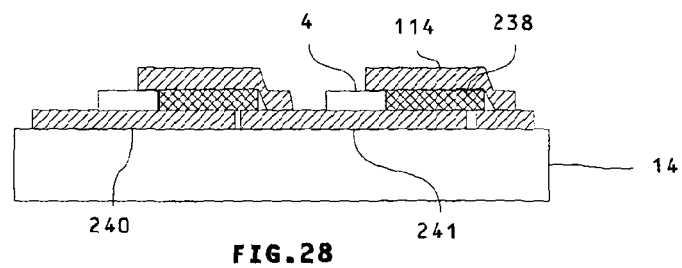
FIG. 28 shows in cross section an LED substrate comprising electrode and heat spreading elements.
Figure 29:
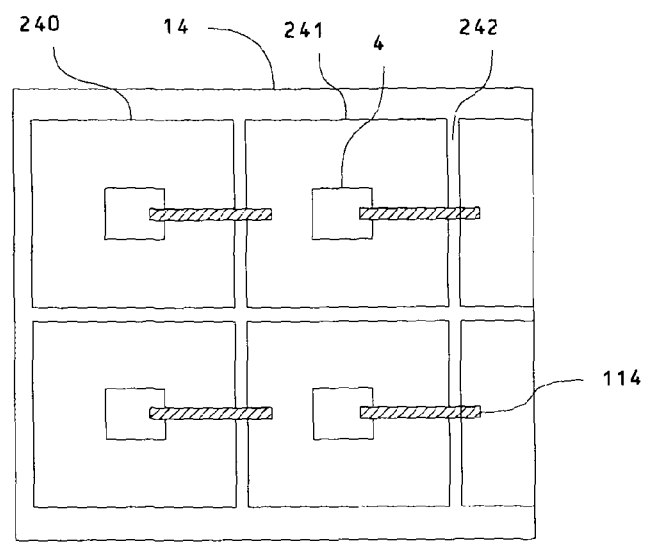
FIG. 29 shows in plan view an LED substrate comprising electrode and heat spreading elements.

It would be desirable to further reduce cost and reduce thermal resistance using lithographically or otherwise defined metal deposition techniques. FIG. 28 shows in cross section and FIG. 29 shows in plan view an embodiment in which film heat spreading elements 240, 241, comprise a metallic film formed on the first substrate 14 using for example aluminium, tantalum, copper or other thermally and electrically conductive materials. The film may be applied by means of known deposition techniques such as sputtering or evaporation and may be subsequently thickened by electroplating. The metallic film (which may be comprised of a stack of metallic films of different materials and geometries) may have a final thickness after processing of greater than about 100 nanometers, for example, greater than 1 micrometer and in one example, greater than 10 micrometers, to achieve low thermal resistance for heat produced in the array of light emitting elements.

Alternatively the metallic film may be printed, for example by means of screen, stencil or flexographic printing which may advantageously provide final thicknesses (after processing) of about 50 micrometers or more. Such thicknesses and material thermal conductivities advantageously provide a reduction in primary thermal resistance to heat generated by the light emitting elements 4. The deposited heat spreader layers may also comprise a thin electrically insulating layer such as an oxide.

Advantageously, metallic films in the present thickness ranges may achieve reduced primary thermal resistance when combined with substrates such as glass of the present thickness ranges. In particular, when combined with microscopic light emitting elements, system thermal performance can be significantly improved in comparison to known macroscopic (e.g. 1×1 mm) light emitting elements on MCPCB. Further, such metallic films can be processed in parallel over large area with high surface quality and low cost and can be combined with electrical connections to further reduce cost. Microscopic light emitting elements that are from a monolithic wafer arranged in an array with their original monolithic wafer positions and orientations relative to each other preserved, achieve efficient transfer of heat into substrates due to their small size. Such microscopic light emitting elements from a monolithic wafer can advantageously be provided in large numbers with precise alignment to electrodes and optics to achieve a high brightness illumination apparatus. In combination with microscopic light emitting elements, the present embodiments thus achieve low system primary thermal resistance. Thus the cost of the system can be substantially reduced in comparison to pick-and-place methods and performance increased.

Gap regions 242 may be provided for example by photoresist patterning and etch steps, or by laser ablation. The spreading elements 240, 241 may provide the bottom electrode for the light emitting elements 4. Additional dielectric layers 238 may be applied between the heat spreading elements 241 and top electrode 114 to provide electrical isolation. In this manner, strings of light emitting elements may be assembled. Thus an electrically insulating element 238 is formed on a heat spreading element 241.

Figure 30:
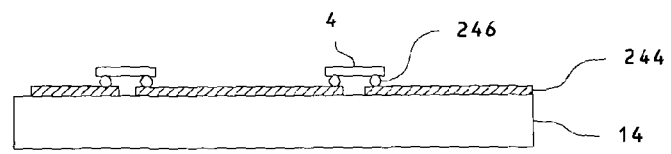
FIG. 30 shows in cross section an alternative LED substrate comprising electrode and heat spreading elements.
Figure 31:
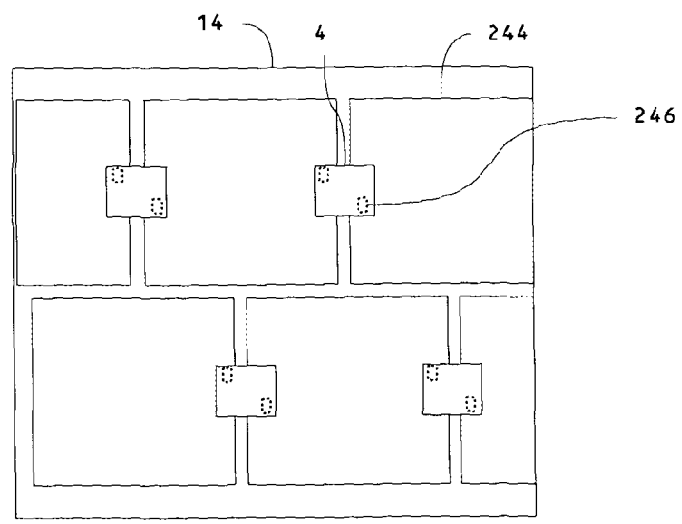
FIG. 31 shows in plan view an arrangement of FIG. 30.

In an alternative embodiment, a lateral configuration light emitting element may be provided between adjacent heat spreading elements 244 and connected by means of contact regions 246 as shown in cross section in FIG. 30 and plan view in FIG. 31. Such an arrangement reduces the complexity of patterning on the substrate 14.

Figure 32:
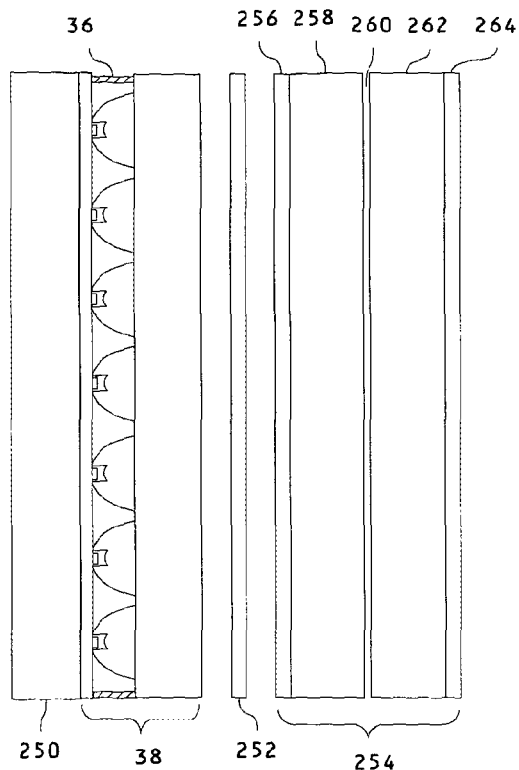
FIG. 32 shows in cross section a display apparatus comprising a backlight illumination apparatus of the present embodiments.

FIG. 32 shows a display embodiment wherein an illumination device 38 is attached to a secondary heat sink 250 and used as a backlight illumination apparatus to illuminate a known liquid crystal display panel 254 comprising polarisers 256, 264, substrates 258, 262 and liquid crystal layer 260. An additional diffuser 252 may be inserted to provide increased uniformity of illumination across the panel. Advantageously such an arrangement provides very efficient coupling of light from the light emitting elements into the panel. The light source can be provided as a single element of the same size as the display panel using the methods of the present embodiments. Further, such illuminator devices can be singulated from glass the same size used to fabricate the panel 254, thus providing a common source of materials and cost reduction.

Figure 33:
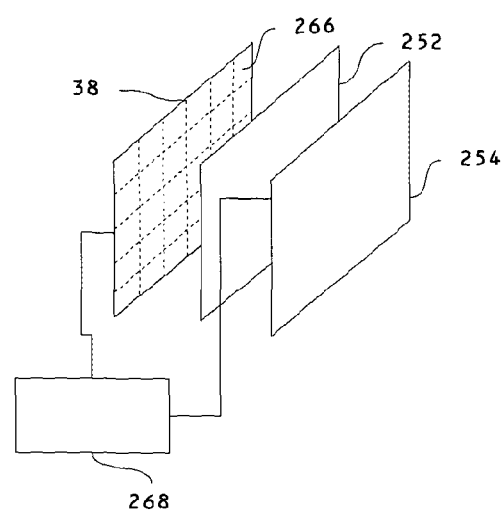
FIG. 33 shows an arrangement of the display apparatus of FIG. 32.

To further improve display ruggedness and reduce thickness, such a backlight illumination apparatus incorporating elements 250, 38, 252 may be bonded to the polariser 256 of the display. Advantageously the present embodiments can provide high uniformity and reducing losses in the diffuser 252 (as a weaker diffuser can be used than would otherwise be required to provide high uniformity). Such a backlight illumination apparatus thus has reduced cost. Further such a backlight illumination apparatus can be used to provide high resolution segmentation of the illumination to the LCD panel as shown in FIG. 33. The backlight illumination apparatus can be addressed as regions 266 to provide variable illumination functions by means of a controller 268 to adjust the illumination in cooperation with the image on the display panel 254 as well known in the display art. Advantageously the present embodiments can provide very high resolution display addressing at low cost.

Figure 34A:
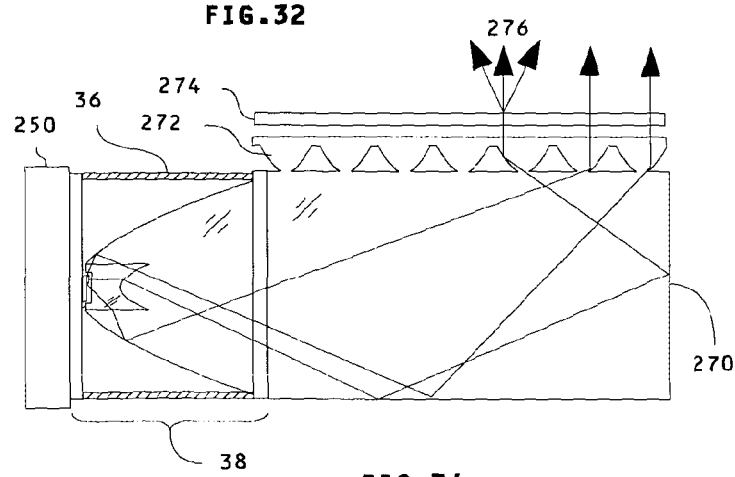
FIG. 34a shows in cross section a backlight illumination apparatus.
Figure 34B:
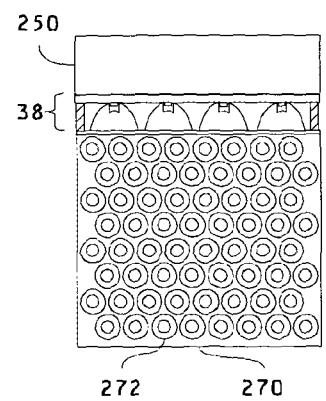

FIG. 34a shows an edge-lit backlight illumination apparatus suitable for illuminating a transmissive or transflective display comprising the illumination cell 38, attached to the edge of a light guide plate 270. Light rays 276 from the cell 38 enter the light guide plate 270 and are guided through light redirecting elements 272 through an optional diffuser 274. Advantageously, the width of the optical elements 35 may be about 2 mm or less when used with microscopic LEDs of size of order 100 micrometers. By way of comparison with known edge lit backlight illumination apparatuses, such an arrangement provides for efficient coupling of light in a thin package. FIG. 34b shows the embodiment of FIG. 34a in plan view. Linear arrays of LEDs can conveniently be extracted from a mothersheet to provide sufficient input illumination power.

The optical elements 72 may for example comprise compound parabolic concentrators. Thus a backlight illumination apparatus comprises the illumination apparatus described herein and a further light guide plate 270 and output coupling optical element 272, 274.

Figure 35:
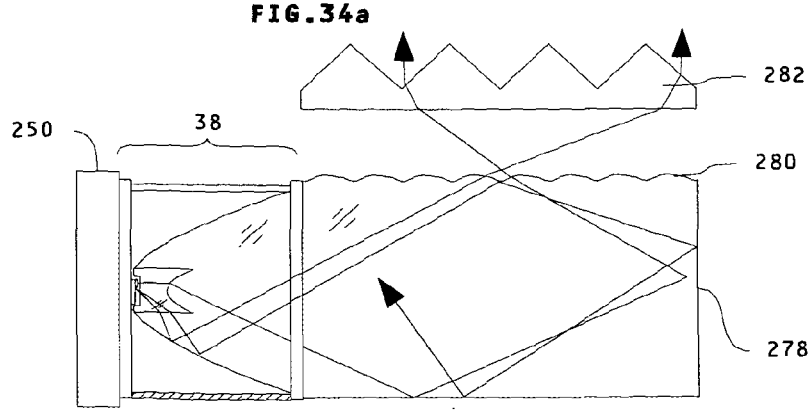
FIG. 35 shows a further backlight illumination apparatus.

A further embodiment of an edge lit backlight illumination apparatus is shown in FIG. 35. Patterned microlens elements 280 are formed on the output surface of the light guide plate 278 so that off-axis light is coupled towards a prism array 282 arranged to direct off-axis light in a forward direction. As for the embodiment of FIG. 34a, the cell 38 provides a very thin and efficient source for coupling light into a thin waveguide.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

The invention claimed is:

1. A method of manufacturing an illumination apparatus whose primary purpose is illumination as opposed to display the method comprising:
   (i) providing a light emitting element array, the light emitting element array comprising a plurality of light emitting elements arrayed on a first side of a first substrate, and the step of providing the light emitting element array comprising forming the plurality of light emitting elements and thereafter positioning them in an array on the first side of the first substrate;
   providing an optical array comprising a plurality of directional optical elements arrayed on a first side of a second substrate;
   (ii) reducing the thickness of the light emitting element array by reducing the thickness of the first substrate by removing material from the direction of the second side of the first substrate; and
   before step (ii) is performed, forming a structure comprising the light emitting element array and the optical array, with the first side of the first substrate facing the first side of the second substrate, and with respective light emitting elements aligned with respective optical elements.

2. The method according to claim 1, further comprising, prior to step (i), providing a plurality of heat spreading elements wherein in step (i) respective heat spreading elements are positioned between the first substrate and respective light emitting elements.

3. The method according to claim 1, wherein the thickness of the structure is further reduced by reducing the thickness of the second substrate by removing material from the direction of the second side of the second substrate.

4. The method according to claim 1, further comprising, after step (ii), performing the following step:
   (iii) increasing the thickness of the light emitting element array by providing one or more heatsink structures at the second side of the first substrate.

5. The method according to claim 4, wherein the thickness added to the light emitting element array by step (iii) is greater than the thickness by which the thickness of the light emitting element was reduced by step (ii).

6. The method according to claim 4, wherein the weight added to the light emitting element array structure by step (iii) is greater than the weight by which the weight of the light emitting element structure was reduced by step (ii).

7. The method according to claim 1, further comprising, prior to providing the light emitting element array, providing a plurality of heat spreading elements wherein, in the step of providing the light emitting element array, respective heat spreading elements are positioned between the first substrate and respective light emitting elements.

8. The method according to claim 1 wherein the plurality of light emitting elements are selectively removed from a monolithic wafer in a manner that preserves the relative spatial position of the selectively removed light-emitting elements.

9. The method according to claim 1 wherein the material of at least the first substrate comprises a ceramic material.

10. The method according to claim 1 wherein the material of at least the first substrate comprises a glass material.

11. The method according to claim 2 wherein the heat spreading elements comprise a metallic film formed on the first substrate.

12. The method according to claim 1 wherein the thickness of the first substrate after step (ii) is between about 0.01 mm and about 1.1 mm thick.

13. The method according to claim 1 wherein the first substrate after step (ii) is between about 0.05 mm and about 0.2 mm thick.

14. The method of manufacturing an illumination apparatus according to claim 1; the method further comprising:
   forming at least one seal between the first and second substrates.

15. An illumination apparatus whose primary purpose is illumination as opposed to display, the illumination apparatus comprising:
- a light emitting element array;
- a structure comprising the light emitting element array and an optical array, the optical array comprising a plurality of directional optical elements arrayed on a first side of a second substrate;
- the light emitting element array comprising a plurality of light emitting elements arrayed on a first substrate, the light emitting elements having been arrayed on the first substrate after the light emitting elements were formed; and
- the first side of the first substrate facing the first side of the second substrate, and respective light emitting elements aligned with respective optical elements,
- wherein a thickness of the first substrate is reduced after the structure is formed.

16. The illumination apparatus according to claim 15, further comprising a plurality of heat spreading elements, respective heat spreading elements being positioned between the first substrate and respective light emitting elements.

17. An illumination apparatus according to claim 15, wherein the light emitting element array further comprises one or more heatsink structures at the second side of the first substrate.

* * * * *